United States Patent [19]

Rubner et al.

[11] E Re. 30,186

[45] Reissued Jan. 8, 1980

[54] METHOD FOR THE PREPARATION OF RELIEF STRUCTURES

[75] Inventors: Roland Rubner, Röttenbach ü. Forchheim; Wolfgang Kleeberg; Eberhard Kühn, both of Erlangen, all of Fed. Rep. of Germany

[73] Assignee: Siemens Aktiengesellschaft, Munich, Fed. Rep. of Germany

[21] Appl. No.: 972,432

[22] Filed: Dec. 22, 1978

Related U.S. Patent Documents

Reissue of:

[64] Patent No.: 4,040,831
Issued: Aug. 9, 1977
Appl. No.: 598,829
Filed: Jul. 24, 1975

[30] Foreign Application Priority Data

Aug. 2, 1974 [DE] Fed. Rep. of Germany ..... 2437348

[51] Int. Cl.[2] ..... G03C 5/00

[52] U.S. Cl. ..... 430/325; 430/283; 430/284; 430/306; 430/313; 204/159.14; 204/159.19

[58] Field of Search ..... 96/35.1, 115 R, 115 P; 260/468 J, 47 CZ

[56] References Cited

U.S. PATENT DOCUMENTS

| | | | |
|---|---|---|---|
| 3,475,176 | 10/1969 | Rauner | 96/115 R |
| 3,650,746 | 3/1972 | Bailey | 96/35.1 |
| 3,753,720 | 8/1973 | Kloczewski et al. | 96/35.1 |
| 3,801,638 | 4/1974 | Cerwonka | 96/115 P |
| 3,847,767 | 11/1974 | Kloczewski | 96/115 P |
| 3,858,510 | 1/1975 | Kai et al. | 96/115 P |
| 3,957,512 | 5/1976 | Kleeberg et al. | 96/35.1 |

*Primary Examiner*—Edward C. Kimlin
*Attorney, Agent, or Firm*—Kenyon & Kenyon

[57] ABSTRACT

The invention provides a method for the preparation of relief structures of highly heat-resistant polymers, using radiation-sensitive, soluble preliminary polymers in the form of polyaddition or polycondensation products of polyfunctional carbocyclic or heterocyclic compounds containing radiation-sensitive radicals in ester groups bound to said compounds with diamines, diisocyanates, bis-acid chlorides or dicarboxylic acids of cyclic structure. According to the invention, the polyfunctional compounds containing the radiation-sensitive radicals contain, besides carboxyl, carboxylic acid chloride, amino, isocyanate or hydroxyl groups suitable for addition or condensation reactions, partly in ortho or periposition thereto, radiation-reactive radicals in the ester groups bound to the compounds having an oxyalkylene methacrylate or acrylate structure.

7 Claims, No Drawings

METHOD FOR THE PREPARATION OF RELIEF STRUCTURES

Matter enclosed in heavy brackets [ ] appears in the original patent but forms no part of this reissue specification; matter printed in italics indicates the additions made by reissue.

BACKGROUND OF THE INVENTION

This invention concerns an improvement and further development of the method according to the U.S. Pat. Application Ser. No. 444,552, now U.S. Pat. No. 3,957,512, herein incorporated by reference, for the preparation of relief structures of highly heat-resistant polymers by applying radiation-sensitive, soluble preliminary polymers to a substrate in the form of a layer or a foil; irradiating the radiation-sensitive layer or foil through negative patterns; dissolving or removing the nonirradiated layer or foil parts and, optionally, subsequently annealing the relief structures obtained, using polyaddition or polycondensation products of polyfunctional carbocyclic or heterocyclic compounds containing radiation-sensitive radicals, with diamines diisocyanates, bis-acid chlorides or dicarboxylic acids as the soluble preliminary polymers wherein:

a. the polyfunctional compounds containing radiation-sensitive radicals R* contain two carboxyl, carboxylic acid chloride, amino, isocyanate or hydroxyl groups suitable for addition or condensation reactions and, partly in ortho or peri position thereto, radiation-reactive groups, bound to carboxyl groups, as esters having the following structure:

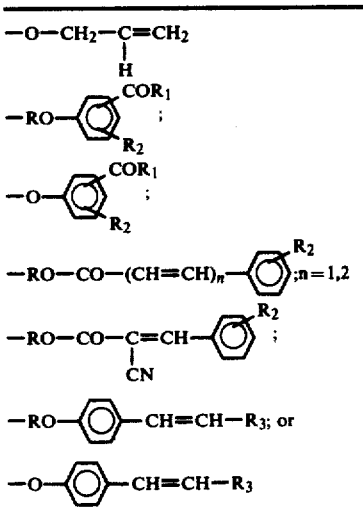

R = oxyalkylene $R_1$ = alkyl, phenyl, alkoxyphenyl or halogenphenyl $R_2$ = H, Cl, alkyl or alkoxy $R_3$ = carbocyclic or heterocyclic, aromatic nucleus bound via ring carbon atom and wherein;

b. the diamines, diisocyanates, bis-acid chlorides or dicarboxylic acids to be reacted with these compounds contain at least one cyclic structure element.

SUMMARY OF THE INVENTION

It has now been found that one can obtain more than radiation-sensitive soluble preliminary polymers which require substantially shorter exposure times, if in the preparation of relief structures according to the U.S. Pat. Application Ser. No. 444,552, now U.S. Pat. No. 3,957,512, oxyalkylenemethacrylate and -acrylate groups of the following structure:

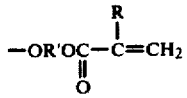

wherein R is hydrogen or methyl and R′ is an alkylene group, are used in place of the radiation-reactive groups as shown in (a) above.

The preparation of the soluble preliminary polymers can be carried out as a "one-pot" reaction if hexamethyl phosphoric acid triamide is used as the solvent.

To increase the cross-linking speed, commonly used photo initiators and/or sensitizers can be employed, of. Industrie Chimique Belge, vol. 24, pages 739 to 64 (1959) or Light-Sensitive Systems by J. Kosar, John Wiley & Sons Inc., New York, New York 1965, pages 143 to 46 and 160 to 88. Highly suited sensitizers and/or initiators are, for instance, Michler's ketone and/or benzoin ether, 2-tert-butyl-9,10-anthraquinone, 1,2-benz-9,10-anthraquinone, 4,4′-(diethylamino)-benzophenone.

In addition, the soluble preliminary polymer stages can be combined for this purpose with further radiation-sensitive, copolymerizable compounds. Well suited are, for instance, compounds which contain one or several N-substituted maleimide groups.

With the method of the present invention, relief structures with sharp edges of highly heat-resistant polymers can be prepared, utilizing the increased light sensitivity of the readily available soluble preliminary polymers. It is particularly suitable for the preparation of miniaturized circuits and of protective layers for semiconductor components, also for solder protection layers on multi-layer circuits, as miniaturized insulating layers on electrically conducting and/or semiconducting and/or insulating base materials and for layered circuits, as insulating layers for printed circuits with conductors made by electroplating, as image storage devices that can be read out optically and for printing forms.

The invention will be explained in further detail by the following examples.

EXAMPLE 1 - Preparation of the Soluble Preliminary Polymer Stage

Exactly 21.8 parts by weight pyromellitic acid diandydride were dissolved in 100 parts by volume hexamethyl phosphoric acid triamide, reacted dropwise, while being cooled in ice and stirred, with 26 parts by weight methacrylic acid-2-hydroxyethyl ester and then stirred at room temperature for 4 days. The solution was subsequently reacted dropwise at −5° to −10° C. with 24 parts by weight thionyl chloride and stirring was continued for 1 hour. Then a solution of 19.8 parts by weight 4,4′-diamino diphenyl methane in 50 parts by volume dimethyl acetamide was added dropwise, and stirring was continued, the last part without cooling, for one hour.

The soluble preliminary polymer stage was precipitated by adding the solution dropwise to 2000 parts by volume water and washed with water and ethanol.

Preparation of Relief Structures

About 5 parts by weight of the preliminary polymer stage and 0.1 part by weight Michler's ketone were dissolved in 20 parts by volume dimethyl formamide. Then the solution was filtered and centrifuged on aluminum foil to form uniform films which, after evaporation of the solvent, were 3 μm thick. The films were irradiated with a 500-W very-high-pressure mercury lamp at a distance of 23 cm through a contact pattern for 2 min, immersed for 30 seconds in γ-butyrolactone and washed with toluol. A resolution better than 20 μm was achieved with good edge definition. The samples obtained were annealed for 20 minutes at 300° C. In the process, the resolution and the edge definition remained unchanged and the relief structures then exhibited the excellent thermal, mechanical, electrical and chemical properties of the polyimide polydiphenyl methane pyromelliticimide. The IR spectrum of the annealed samples showed the bands at 5.6 μm typical for the imide structure.

EXAMPLE 2

Preparation of the Soluble Preliminary Polymer Stage

Instead of 4,4'-diamino diphenyl, 4,4'-diaminophenyl ether was used, otherwise the procedure was as in Example 1.

Preparation of Relief Structures

Five parts by weight of the preliminary polymer stage, 0.5 parts by weight N-phenyl maleimide and 0.05 parts by weight Michler's ketone were dissolved in 20 parts by volume dimethyl formamide, filtered and centrifuged on aluminum foil to form uniform films, which, after evaporation of the solvent, were 2 μm thick. The films were irradiated, as described in Example 1, for 60 sec, developed for 30 sec in γ-butyrolactone and washed with toluol. A resolution better than 20 μm was achieved with good edge definition. The samples obtained were annealed for 20 min at 300° C. In the process, the resolution and the edge definition remained unchanged and the relief structures then exhibited the excellent thermal, mechanical, electrical and chemical properties of the polyimide polydiphenyl oxide pyromelliticimide. The IR spectrum of the annealed samples showed the bands at 5.6 μm typical for the imide structure.

What is claimed is:

1. In a method for the preparation of relief structures consisting of highly heat resistant polymers comprising the steps of applying a soluble, photo or radiation-sensitive prepolymer in the form of a film or foil to a substrate, said prepolymer being a poly-addition or polycondensation prepolymer having repeating units of the formula:

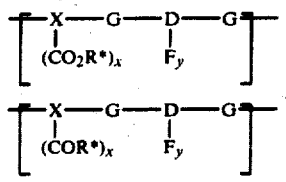

wherein,

X and D each comprise a carbocyclic and/or heterocyclic nucleus;

G is selected from the group consisting of amide, urea or urethane linkages;

R* is an organic radical containing a photo- or radiation induced di- or polymerizable olefinic double bond; and is a component of ester group [$CO_2R^*$] *COR** said group bound to said nucleus in ortho or peri-position to G;

F is a group capable of reacting with the carbonyl group of [$CO_2R^*$] *COR** to form a cyclic structure upon heating of the prepolymer to liberate R*OH; and wherein F is arranged in ortho- or peri-position to G;

x is 1 or 2; and y is 0 or 2;

exposing or irradiating the photo or radiation active layer through a negative pattern, dissolving or stripping the unexposed or unirradiated portions and annealing the relief structure obtained; the improvement which comprises using as said R*, a radical represented by the formula:

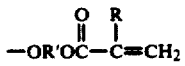

wherein R is hydrogen or methyl and R' is an alkylene group.

2. The method of claim 8, wherein the radiation-reactive radical R* is a β-oxyethylenemethacrylate radical.

3. The method of claim 1 wherein the soluble prepolymer is irradiated together with compounds which contain one or several N-substituted maleimide groups.

4. The method claim 3 wherein the soluble prepolymer is irradiated together with N-phenyl maleimide.

5. Method of claim 4, wherein the N-phenyl maleimide content is less than 20 percent by weight of the prepolymer.

6. The method of claim 5 wherein the N-phenyl maleimide content is between about 2 and 10 percent by weight of said prepolymer.

7. The method of claim 1 wherein the prepolymer is prepared in hexamethyl phosphoric acid triamide.

* * * * *

UNITED STATES PATENT AND TRADEMARK OFFICE

CERTIFICATE OF CORRECTION

PATENT NO. : Re 30,186

DATED : January 8, 1980

INVENTOR(S) : Roland Rubner, et al.

It is certified that error appears in the above—identified patent and that said Letters Patent is hereby corrected as shown below:

Claim 1, Col. 4, lines 1 through 5 should read as follows:

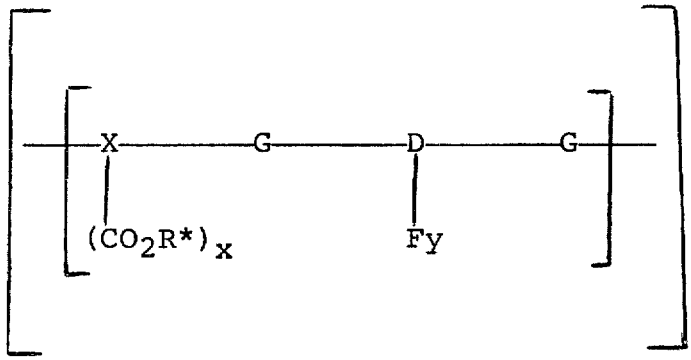

UNITED STATES PATENT AND TRADEMARK OFFICE

CERTIFICATE OF CORRECTION

PATENT NO. : Re 30,186

DATED : January 8, 1980

INVENTOR(S) : Roland Rubner, et al.

It is certified that error appears in the above—identified patent and that said Letters Patent is hereby corrected as shown below:

Claim 1, Col. 4, lines 5 through 9 should read as follows:

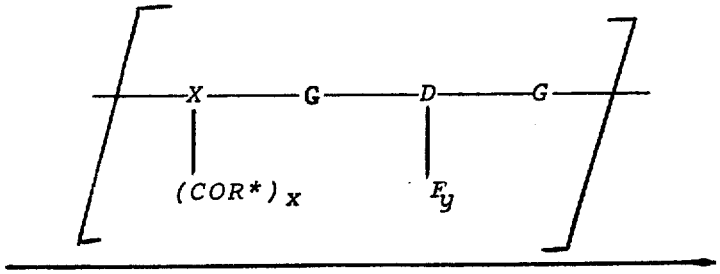

Signed and Sealed this

First Day of July 1980

[SEAL]

Attest:

SIDNEY A. DIAMOND

Attesting Officer

Commissioner of Patents and Trademarks